(12) United States Patent
Iwamizu

(10) Patent No.: US 10,868,530 B2
(45) Date of Patent: Dec. 15, 2020

(54) SEMICONDUCTOR DEVICE AND METHOD FOR CONTROLLING SEMICONDUCTOR DEVICE

(71) Applicant: FUJI ELECTRIC CO., LTD., Kawasaki (JP)

(72) Inventor: Morio Iwamizu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/521,007

(22) Filed: Jul. 24, 2019

(65) Prior Publication Data
US 2020/0091911 A1 Mar. 19, 2020

(30) Foreign Application Priority Data
Sep. 18, 2018 (JP) .................................. 2018-173583

(51) Int. Cl.
*H03B 1/00* (2006.01)
*H03K 3/00* (2006.01)
(Continued)

(52) U.S. Cl.
CPC ....... *H03K 17/6871* (2013.01); *H01L 29/063* (2013.01); *H01L 29/0638* (2013.01);
(Continued)

(58) Field of Classification Search
CPC .. H03K 17/6871; H03K 19/20; H01L 29/402; H01L 29/7813; H01L 29/7805;
(Continued)

(56) References Cited

U.S. PATENT DOCUMENTS 8,604,522 B2* 12/2013 Takebuchi .......... H01L 21/2652
257/244
8,841,940 B2* 9/2014 Barrenscheen ..... H02M 3/3376
327/108
(Continued)

FOREIGN PATENT DOCUMENTS

JP 4178831 B2 11/2008
JP 2009-88006 A 4/2009
(Continued)

OTHER PUBLICATIONS

Tsukasa Suzuki et al., "Development of RBPMOS (MOS FET with Reverse Connection Battery Protection) for Automotive Application", Sanken Technical Report, vol. 42, 2010. (pp. 15-18).

*Primary Examiner* — Metasebia T Retebo

(57) ABSTRACT

A semiconductor device includes a main switching circuit implemented by a first semiconductor element and a second semiconductor element having a semiconductor region of a first conductivity type as a common region, including respectively a first well region of a second conductivity type and a second well region of a second conductivity type provided in an upper portion of the common region, the first semiconductor element being provided with a first source region of the first conductivity type in an upper portion of the first well region, the second semiconductor element being provided with a second source region of the first conductivity type in an upper portion of the second well region; and a drive circuit configured to independently apply a first drive signal and a second drive signal respectively to a control electrode of the first semiconductor element and a control electrode of the second semiconductor element.

16 Claims, 12 Drawing Sheets

(51) Int. Cl.
    *H03K 17/687*     (2006.01)
    *H01L 29/06*     (2006.01)
    *H01L 29/10*     (2006.01)
    *H01L 29/45*     (2006.01)
    *H01L 29/78*     (2006.01)
    *H01L 29/40*     (2006.01)
    H03K 19/20     (2006.01)

(52) U.S. Cl.
    CPC ........ *H01L 29/1095* (2013.01); *H01L 29/402* (2013.01); *H01L 29/45* (2013.01); *H01L 29/7805* (2013.01); *H01L 29/7813* (2013.01); H03K 19/20 (2013.01)

(58) Field of Classification Search
    CPC . H01L 29/45; H01L 29/1095; H01L 29/0638; H01L 29/063
    USPC .......................................................... 327/109
    See application file for complete search history.

(56) References Cited

U.S. PATENT DOCUMENTS

| | | | |
|---|---|---|---|
| 10,277,219 B2 * | 4/2019 | Sander | H01L 25/16 |
| 2014/0070319 A1 | 3/2014 | Tonomura et al. | |
| 2016/0020276 A1 | 1/2016 | Lu | |
| 2018/0183427 A1 | 6/2018 | Nakajima et al. | |

FOREIGN PATENT DOCUMENTS

| | | |
|---|---|---|
| JP | 2016-21539 A | 2/2016 |
| JP | 5990437 B2 | 9/2016 |
| JP | 2018-107331 A | 7/2018 |

* cited by examiner

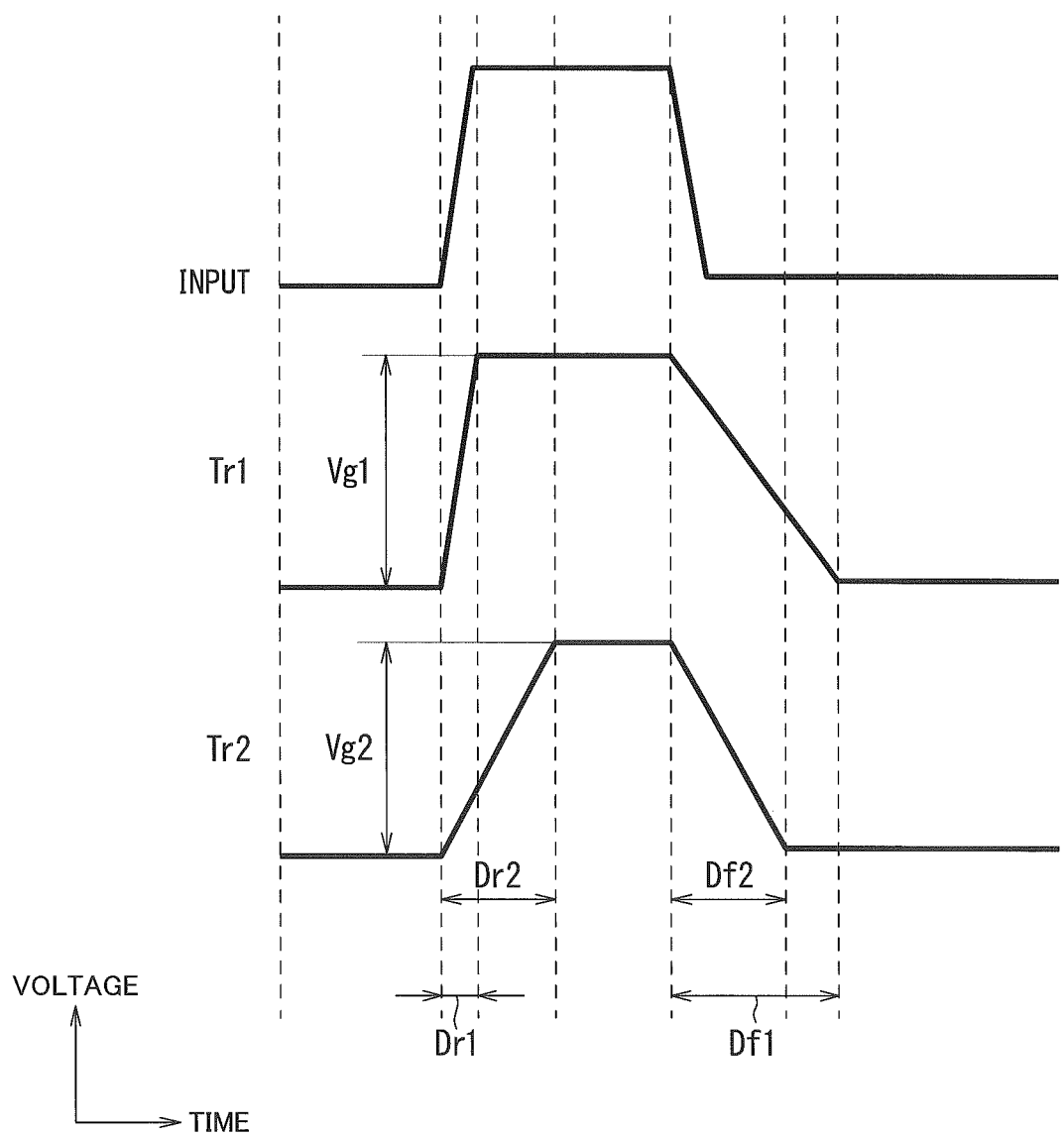

SEMICONDUCTOR DEVICE AND METHOD FOR CONTROLLING SEMICONDUCTOR DEVICE

CROSS REFERENCE TO RELATED APPLICATIONS

This application is based upon and claims the benefit of priority from the prior Japanese Patent Application No. P2018-173583 filed on Sep. 18, 2018, the entire contents of which are incorporated herein by reference.

BACKGROUND OF THE INVENTION

1. Field of the Invention

The present invention relates to a semiconductor device and a control method of the semiconductor device, more particularly to a power semiconductor device which can be used for a main switching circuit for protection in an electric circuit and a control method of the power semiconductor device.

2. Description of the Related Art

JP 4178331 discloses that a bidirectional power switch is used for a power converter and the like. In a drive circuit for automotive electrical equipment, a semiconductor switch is provided on an upstream side in order to prevent damage to an electronic control unit (ECU), for example. When an abnormality occurs in the drive circuit, the drive circuit is blocked by the semiconductor switch to protect the ECU. In an electric circuit used for a vehicle and the like, since a battery could be accidentally connected inversely a demand for protection against damage to an ECU has increased.

A semiconductor switch in which power semiconductor elements, such as discrete n-type metal-insulator-semiconductor (MIS) transistors, are bidirectionally arranged, is conventionally used in order to prevent destruction of an electric circuit and the like. In such a conventional bidirectional semiconductor switch, a source electrode of a first MIS transistor is connected to a source electrode of a second MIS transistor. In the semiconductor switch, the first and second MIS transistors are in a conduction state in normal use so that a current flows from a drain electrode of the first MIS transistor to a drain electrode of the second MIS transistor. When a large current flows due to an abnormality caused in a load and the like, the first and second MIS transistors are turned off to prevent destruction of the load and the like. When discrete products, such as the MIS transistors and the like, are arranged in a planar manner to implement the semiconductor switch, it is difficult to reduce in size of the electric circuit due to an increase in mounting area.

JP 5990437 discloses a structure in which MIS transistors having a drain electrode in common are provided to form a bidirectional semiconductor switch into one chip. In the semiconductor switch, a current flows from a source electrode of the first MIS transistor to a source electrode of the second MIS transistor via the common drain electrode in normal use. Although the first MIS transistor is connected in a reverse direction, the first MIS transistor can be turned on by increasing the gate voltage. Further, since a body diode of the first MIS transistor is connected in a forward direction, a current can also flow via the body diode. In the case of abnormality in a load and the like or reverse connection of a battery, the first and second MIS transistors are turned off, so as to prevent destruction of the electric circuit or wires connected to a power supply via the semiconductor switch.

In the bidirectional semiconductor switch having the drain electrode in common, a parasitic bipolar transistor is formed in which the respective p-type well regions of the first and second MIS transistors serve as an emitter region and a collector region, and the common drain region serves as a base region. If a drive timing for turning on or turning off the respective first and second MIS transistors is deviated from each other, the parasitic bipolar transistor may operate to lead a decrease in reliability of the semiconductor switch.

SUMMARY OF THE INVENTION

An aspect of the present invention inheres in a semiconductor device, including: (a) a main switching circuit implemented by a first semiconductor element and a second semiconductor element having a semiconductor region of a first conductivity type as a common region, including respectively a first well region of a second conductivity type and a second well region of a second conductivity type provided in an upper portion of the common region, the first semiconductor element being provided with a first source region of the first conductivity type in an upper portion of the first well region, the second semiconductor element being provided with a second source region of the first conductivity type in an upper portion of the second well region; and (b) a drive circuit configured to independently apply a first drive signal and a second drive signal respectively to a control electrode of the first semiconductor element and a control electrode of the second semiconductor element.

Another aspect of the present invention inheres in a method for controlling semiconductor device which includes a main switching circuit implementing by an insulated gate first semiconductor element and an insulated gate second semiconductor element having a semiconductor region of a first conductivity type as a common region, including respectively a first well region of a second conductivity type and a second well region of a second conductivity type formed in an upper portion of the common region, the first semiconductor element being provided with a first surface electrode electrically connected to a power supply terminal on an upper surface of a first source region of the first conductivity type provided in an upper portion of the first well region, the second semiconductor element being provided with a second surface electrode electrically connected to an output terminal on an upper surface of a second source region provided in an upper portion of the second well region, the method encompassing: (a) applying a first drive signal to a control electrode of the first semiconductor element to control a turn-on and a turn-off of the first semiconductor element; and (b) applying a second drive signal, independent of the first drive signal, to a control electrode of the second semiconductor element to control a turn-on and a turn-off of the second semiconductor element, wherein the turn-on and the turn-off by the second drive signal are switched during the first semiconductor element is in the turn-on.

BRIEF DESCRIPTION OF THE DRAWINGS

FIG. 12 is a timing chart for explaining an example of a control method of the semiconductor device according to the second embodiment of the present invention;

DETAILED DESCRIPTION

Figure 1:
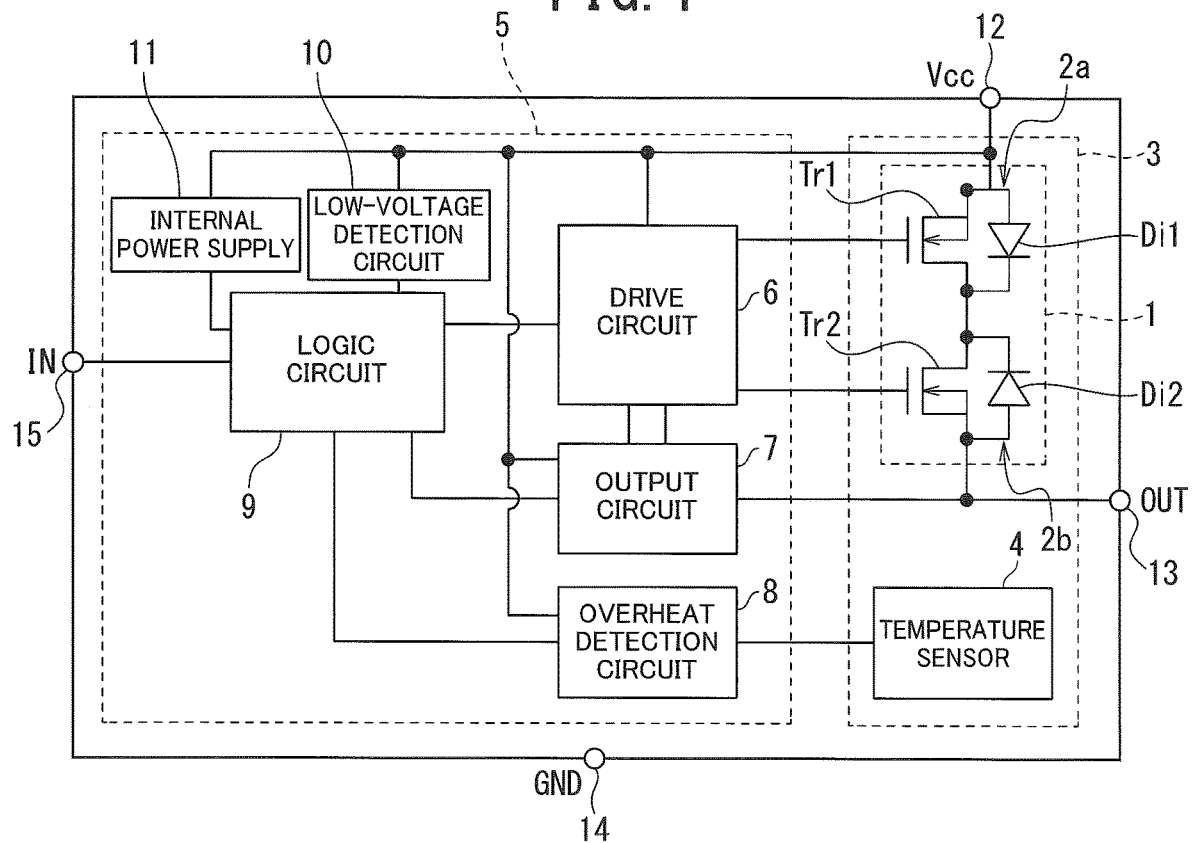
FIG. 1 is a block diagram illustrating an example of a semiconductor device according to a first embodiment of the present invention.

First and second embodiments of the present invention will be described below with reference to the drawings. In the following description of the drawings, the same or similar parts are denoted by the same or similar reference numerals. However, it should be noted that the drawings are schematic, the relationship between the thickness and the planar dimension, the ratio of the thickness of each device and each member, etc. may be different from the actual one. Therefore, specific thicknesses and dimensions should be determined with reference to the following description. In addition, it should also be understood that the respective drawings are illustrated with the dimensional relationships and proportions different from each other.

In the following description, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "left" is changed to the "right", and the "right" is changed to the "left". In the following description, the case where a first conductivity type is n-type and a second conductivity type is p-type will be exemplarily described. However, it is also possible to select the conductivity type in an inverse relationship so that the first conductivity type is p-type and the second conductivity type is n-type. In addition, the superscript "+" or "−" added to the mark "n" or "p" denotes that a semiconductor region has relatively high or low impurity concentration as compared with a region without the superscript "+" or "−" added. It should be noted that semiconductor regions denoted by the same mark, such as "p", do not necessarily have exactly the same impurity concentration.

A "first or third main-electrode region" of each semiconductor element used in a main switching circuit of a semiconductor device denotes one of a source region and a drain region in a field-effect transistor (FET) or a static-induction transistor (SIT). A "second or fourth main-electrode region" denotes either the source region or the drain region which is not the first or third main-electrode region in FET or SIT. As above, when the "first or third main-electrode region" of each semiconductor element used in the main switching circuit is the drain region, the "second or fourth main-electrode region" denotes the source region. When the bias relationship is exchanged, in a symmetrically structured FET or the like, the function of the "first or third main-electrode region" and the function of the "second or fourth main-electrode region" may be exchanged. A "control electrode" denotes an electrode for controlling a main current flowing between the first main-electrode region and the second main-electrode region or between the third main-electrode region and the fourth main-electrode region. For example, in the FET or the SIT, a gate electrode for controlling a main current flowing between the source region and the drain region corresponds to the control electrode.

First Embodiment

A semiconductor device according to a first embodiment of the present invention includes a power circuit chip 3 and a control circuit chip 5, as illustrated in FIG. 1. The power circuit chip 3 includes a main switching circuit 1 and a temperature sensor 4. The main switching circuit 1 is a bidirectional switch including a first semiconductor element 2a and a second semiconductor element 2b, in which drain electrodes (first and third main electrodes) of the first and second semiconductor elements 2a and 2b are connected in common to each other in the opposite directions. A source electrode (a second main electrode) of the first semiconductor element 2a is connected to a power source node 12 for power source ($V_{CC}$) connection, and a source electrode (a fourth main electrode) of the second semiconductor electrode 2b is connected to an output node 13 for output (OUT). The temperature sensor 4 detects a change in temperature due to a flow of current in the main switching circuit 1.

The control circuit chip 5 includes a drive circuit 6, an output circuit 7, an overheat detection circuit 8, a low-voltage detection circuit 10, a logic circuit 9, and an internal power supply 11. The drive circuit 6 is connected to the respective gate electrodes (control electrodes) of the first and second semiconductor elements 2a and 2b to drive the first and second semiconductor elements 2a and 2b. The output circuit 7 is connected to the output node 13 to control the output of the main switching circuit 1. The overheat detection circuit 8 acquires a temperature detected by the temperature sensor 4 so as to detect overheat in a load connected to the output node 13 caused by a short circuit and the like. The low-voltage detection circuit 10 detects a decrease in voltage of an external power source such as a battery connected to the power source node 12. The logic circuit 9 is connected to the drive circuit 6, the output circuit 7, the overheat detection circuit 8, and the low-voltage detection circuit 10. The logic circuit 9 connects to an input node 15 for input (IN) of a signal and the like. The logic circuit 9 transmits a drive signal for the main switching circuit 1 to the drive circuit 6. When overheat or a decrease in voltage is detected in the overheat detection circuit 8 or the low-voltage detection circuit 10, the logic circuit 9 transmits a turn-off signal for the main switching circuit 1 to the drive circuit 6. The internal power supply 11 supplies a power supply voltage to the logic circuit 9. The respective wires for ground (GND) of the power circuit chip 3 and the control circuit chip 5 are connected to a ground node 14.

The first and second semiconductor elements 2a and 2b are preferably semiconductor elements having an insulated gate structure, such as a MIS field-effect transistor (FET) and a MIS static-induction transistor (SIT). The first and second semiconductor elements 2a and 2b may have a vertical structure or a horizontal structure. As can be understood from the following description, for the first and second semiconductor elements 2a and 2b, a vertical structure in which a main current flows in the depth direction of the chip may be desirable. Hereinafter, a description will be given by adopting a MISFET having a trench gate structure using silicon (Si) as the first and second semiconductor elements 2a and 2b. However, it will be obvious to those skilled in the art that the MIS transistor having a planar gate structure exhibit the same effectiveness from understanding the gist of the present invention from the following explanation. For a semiconductor material of the first and second semiconductor elements 2a and 2b, in addition to silicon (Si), a wide band gap semiconductor material, such as silicon carbide (SiC), gallium nitride (GaN), diamond, or aluminum nitride (AlN), which has a forbidden band width wider than Si of 1.1 eV may be used. Note that the MIS transistor is a concept including a MISFET and a MISSIT.

As illustrated in FIG. 1, a source S and a drain D of a MIS transistor Tr1 of the first semiconductor element 2a are respectively connected in antiparallel to an anode and a cathode of a body diode Di1. A drain D and a source S of a MIS transistor Tr2 of the second semiconductor element 2b are respectively connected in antiparallel to a cathode and an anode of a body diode Di2. The gate G of the MIS transistor Tr1 and A gate G of the MIS transistor Tr2 are connected to the drive circuit 6 independently of each other. The source S of the MIS transistor Tr2 of the second semiconductor element 2b is connected to an external load via the output node 13.

Figure 2:
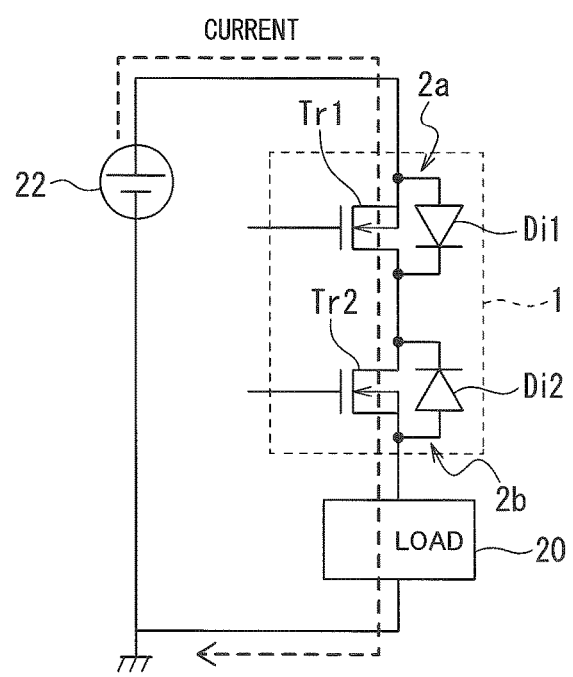
FIG. 2 is a circuit diagram illustrating an example of a main switching circuit of the semiconductor device according to the first embodiment of the present invention.

An operation of driving the main switching circuit 1 by a control method according to the first embodiment will be given below with reference to FIG. 2 to FIG. 4. As illustrated in FIG. 2, the source S of the MIS transistor Tr1 of the first semiconductor element 2a is connected to an external power supply 22, such as a battery for a vehicle, and the source S of the MIS transistor Tr2 of the second semiconductor element 2b is connected to a load 20 such as an ECU. A voltage signal of a high (H) level equal to or higher than each threshold of the MIS transistors Tr1 and Tr2 is applied from the drive circuit 6 to each of the gates G of the MIS transistors Tr1 and Tr2, so as to lead the MIS transistors Tr1 and Tr2 to be a turn-on state. In such case, a current flows from the external power supply 22 into the load 20 through the main switching circuit 1, as indicated by the dotted line in FIG. 2. Although the source S and the drain D of the MIS transistor Tr1 are connected in a reverse direction, the MIS transistor Tr1 can be turned on by increasing the gate voltage. When an abnormality occurs in the load 20 and a large current flows, a voltage signal of a low (L) level lower than each threshold of the MIS transistors Tr1 and Tr2 is applied to each of the gates G of the MIS transistors Tr1 and Tr2 from the drive circuit 6 so as to turn off the MIS transistors Tr1 and Tr2. Although the body diode Di1 is in a turn-on state, the current can be turned off since the MIS transistor Tr2 is in a turn-off state.

Figure 3:
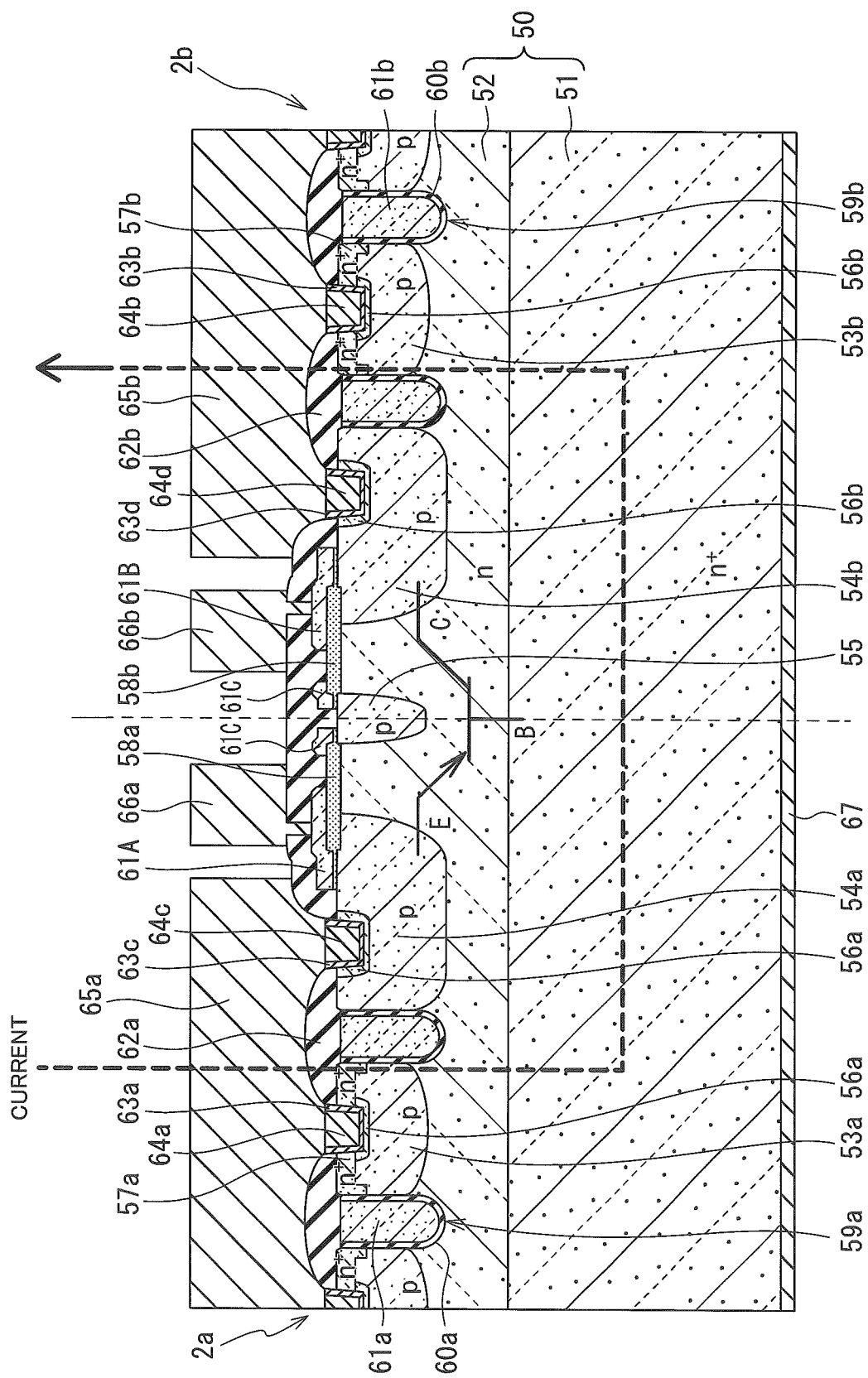
FIG. 3 is a schematic cross-sectional view illustrating an example of a power circuit chip of the semiconductor device according to the first embodiment of the present invention.

As illustrated in FIG. 3, the main switching circuit 1 according to the first embodiment includes the first semiconductor element 2a and the second semiconductor element 2b. A drift region 50 includes a common drain region 51 and a semiconductor region 52 of a first conductivity type (n-type) which is epitaxially grown on a top surface of the common drain region 51. In the semiconductor region 52, well regions 53a, 53b, 54a, 54b of a second conductivity type (p-type) and a channel stopper region 55 of p-type are formed. The first well region 53a and the second well region 53b serve as base regions. The third well region 54a and the fourth well region 54b serve as reduced-surface-field (RE-SURF) regions. Each depth of the first well region 53a, the second well region 53b, and the channel stopper region 55 from the top surface is substantially the same. Each depth of the third well region 54a and the fourth well region 54b from the top surface is greater than each depth of the first well region 53a and the second well region 53b from the top surface.

A first source region (a second main electrode region) 57a of $n^+$-type is formed on the top surface of the first well region 53a, and a second source region (a fourth main electrode region) 57b of $n^+$-type is formed on the top surface of the second well region 53b. A trench 59a is provided in contact with the first source region 57a, the first well region 53a, and the semiconductor region 52 in order from the surface of the semiconductor region 52, Also, a trench 59b is provided in contact with the first source region 57b, the first well region 53b, and the semiconductor region 52 in order from the surface of the semiconductor region 52, In the trenches 59a, a gate electrode (control electrode) 61a is buried via a gate insulating films 60a provided on an inner side wall and a bottom wall of the trench 59a so as to implement an insulated gate electrode structure (60a, 61a). Also, in a trench 59b, a gate electrode (control electrode) 61b is buried via a gate insulating film 60b provided on an inner side wall and a bottom wall of the trench 59b so as to implement an insulated gate electrode structure (60b, 61b). For each of the gate insulating films 60a and 60b, for example, a silicon oxide ($SiO_2$) film may be used. For each of the gate electrode 61a and 61b, for example, a polysilicon film may be used. The upper portions of the first well regions 53a and the second well region 53b are provided with grooves from the surface of the semiconductor region 52 to reach the first well regions 53a and the second well region 53b, respectively. In the upper portions of the first well regions 53a and the second well region 53b, contact regions 56a and 56b of $p^+$-type, having higher impurity concentration than the first well regions 53a and the second well region 53b, are provided in contact with the bottoms of the grooves, respectively. Source electrodes 64a and 64b are buried in the grooves via source contact layers 63a and 63b provided inside the grooves, respectively. The upper portions of the third well region 54a and the fourth well region Mb are provided with grooves from the surface of the semiconductor region 52 to reach the third well region 54a and the fourth well region 54b, respectively. In the upper portions of the third well regions 54a and the fourth well region 54b, the contact regions 56a and 56b of $p^+$-type, having higher impurity concentration than the third well regions 54a and the fourth well region 54b, are provided in contact with the bottoms of the grooves, respectively. Source electrodes 64c and 64d are buried in the grooves via source contact layers 63c and 63d provided inside the grooves, respectively. For each of the source contact layers 63c and 63d, for example, a nickel silicide (NiSi$_x$) film may be used. For each of the source electrodes 64a and 64b, for example, an aluminum (Al) alloy containing Al as a main component may be used.

The top surface of the semiconductor region 52 between the third well region 54a and the channel stopper region 55, and the fourth well region 54b and the channel stopper region 55, is provided with element isolation films 58a and 58b by local oxidation of silicon (LOCOS) and the like, respectively. A gate extraction electrode 61A, electrically connected to the gate electrode 61a, is provided on a top surface of the element isolation film 58a on a side of the third well region 54a. Also, a gate extraction electrode 61B, electrically connected to the gate electrode 61b, is provided on a top surface of the element isolation film 58b on a side of the fourth well region 54b. Field plate electrodes 61C are provided on the top surfaces of the element isolation films 58a and 58b on sides of the channel stopper region 55, respectively. For each of the gate extraction electrodes 61A, 61B and the field plate electrodes 61C, for example, a polysilicon film and the like may be used.

Interlayer dielectric films 62a and 62b are deposited on the gate electrodes 61a and 61b, the gate extraction electrodes 61A and 61B, and the field plate electrodes 61C. The source electrodes 64a, 64b, 64c, and 64d exposed between the respective interlayer dielectric films 62a and 62b are physically in contact with source electrode pads (surface electrodes) 65a and 65b made of Al, for example. The gate extraction electrodes 61A and 61B exposed between the interlayer dielectric films 62a and 62b are physically in contact with gate electrode pads 66a and 66b made of Al, for example. A drain electrode (a bottom electrode) 67 made of a metal film including an Al alloy containing Al as a main component, gold (Au) and the like, or a laminated film of the above metal films is deposited on a bottom surface of the common drain region 51.

As illustrated in FIG. 3, the MIS transistors Tr1 and Tr2 are trench gate MIS transistors having the insulated gate electrode structures (60a, 61a) and (60b, 61b). The body diode Di1 is implemented by the contact region 56a of $p^+$-type, the well region 53a, 54a of p-type, the semiconductor region 52 of n-type, and the common drain region 51 of $n^+$-type. The body diode Dig is implemented by the contact region 56b of $p^+$-type, the well region 53h, 54b of p-type, the semiconductor region 52, and the common drain region 51. The channel stopper region 55 is delineated into a ring shape in a planar pattern along the peripheries of the first and second semiconductor elements 2a and 2b. The channel stopper region 55 between the first semiconductor element 2a and the second semiconductor element 2b is a single region common to the first and second semiconductor elements 2a and 2b.

Figure 4:
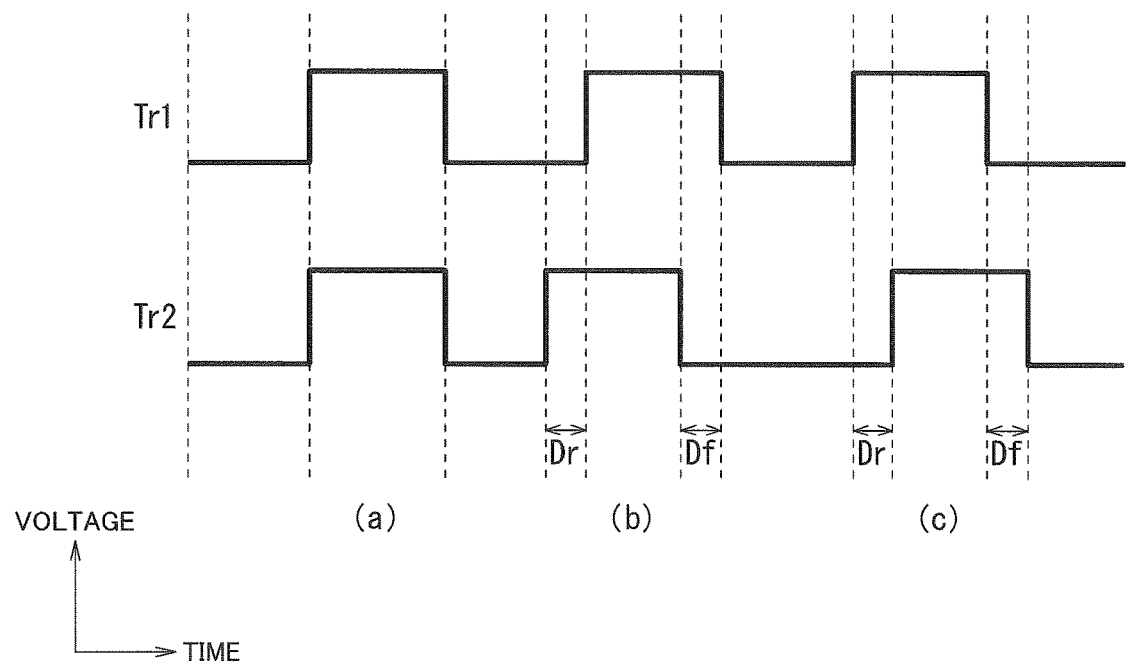
FIG. 4 is a timing chart for explaining a control method of the main switching circuit.

FIG. 4 illustrates voltages at the gates G of the MIS transistors Tr1 and Tr2. As illustrated in part (a) of FIG. 4, signals of the H-level are applied as drive signals to the gates G of the MIS transistors Tr1 and Tr2 substantially at the same time from the drive circuit 6 in the normal conductive state. A current in such case flows from the first source region 57a a toward the second source region 57b via an inversion layer induced in the first well region 53a, the common drain region 51, and an inversion layer induced in the second well region 53b, as indicated by the dotted line in FIG. 3. When the drive signals change to the L level, the MIS transistors Tr1 and Tr2 are turned off substantially at the same time.

The MIS transistors Tr1 and Tr2 are provided to have the common drain region 51 and the semiconductor region 52 in common, as illustrated in FIG. 3. Thus, a parasitic bipolar transistor may be implemented by the third well region 54a of p-type serving as an emitter E, the common drain region 51 of $n^+$-type or the semiconductor region 52 of n-type serving as a base B, and the fourth well region 54b of p-type serving as a collector C.

As illustrated in part (b) of FIG. 4, the MIS transistor Tr2 may rise earlier than the MIS transistor Tr1 by a delay time Dr to be in the turn-on state, if the drive signals applied from the drive circuit 6 to the respective MIS transistors Tr1 and Tr2 are deviated from each other. A conventional semiconductor device has a configuration in which a single signal line is branched from a drive circuit to apply a drive signal to each of the gates G of the MIS transistors Tr1 and Tr2. In such a case, the transmission timing of the drive signal from the drive circuit 6 is not controlled accurately, causing a shift of the drive timing. Further, since the power source voltage $V_{CC}$ is applied from the source S of the MIS transistor Tr1 on the upstream side, the voltage applied to the MIS transistor Tr2 on the downstream side tends to be decreased as compared with the voltage applied to the MIS transistor Tr1. Thus, the MIS transistor Tr2 operates earlier than the MIS transistor Tr1 for the transmitted drive signals of the same voltage level. The MIS transistor Tr1 is in the turn-off state during the delay time Dr illustrated in part (b) of FIG. 4, while the body diode Di1 is in the turn-on state. Therefore, the parasitic bipolar transistor may operate due to a base potential applied between the emitter E and the base B of the parasitic bipolar transistor.

When the drive signal of the MIS transistor Tr2 has substantially the same signal width as the MIS transistor Tr1, as illustrated in part (b) of FIG. 4, the parasitic bipolar transistor does not operate during a delay time Df in the falling time. However, as illustrated in part (c) of FIG. 4, when the drive signal to the MIS transistor Tr2 is applied later than to the MIS transistor Tr1, the parasitic bipolar transistor operates during the delay time Df in the falling time. In such case, the parasitic bipolar transistor does not operate during the delay time Dr in the rising time. The parasitic bipolar transistor thus starts operating when the MIS transistor Tr1 is in the turn-off state and the MIS transistor Tr2 is in the turn-on state. When the parasitic bipolar transistor operates, unnecessary current flows to the main switching circuit 1, which may lead to a problem of a reduction in reliability.

Figure 5:
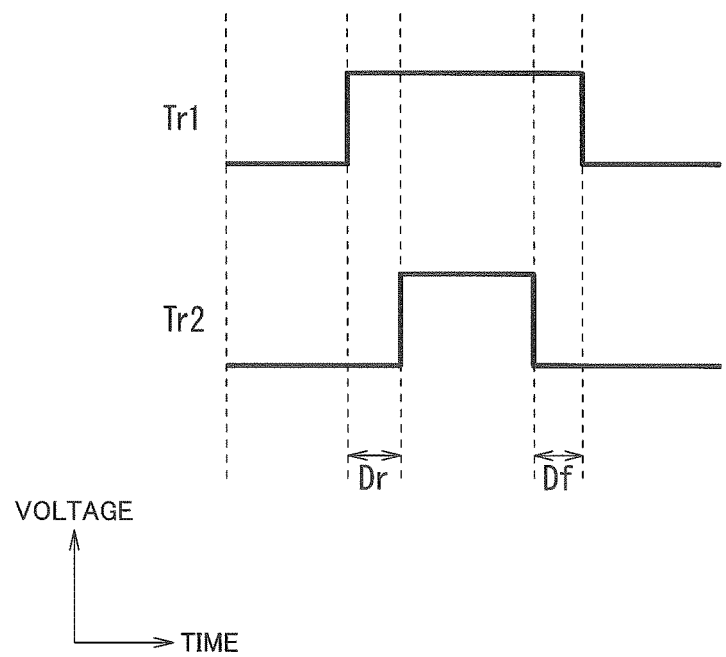
FIG. 5 is a timing chart for explaining an example of a control method of the semiconductor device according to the first embodiment of the present invention.

In the first embodiment, as illustrated in FIG. 1, the respective gates G of the MIS transistors Tr1 and Tr2 are independently connected to the drive circuit 6 with separate signal lines. For example, the drive timing is controlled by increasing the signal width of the drive signal applied to the MIS transistor Tr1 so that the H-level signal is applied to the MIS transistor Tr2 only when the H-level signal is applied to the MIS transistor Tr1, as illustrated in FIG. 5. The parasitic bipolar transistor does not operate either during the delay time Dr in the rising time or during the delay time Df in the falling time. FIG. 5 illustrates the voltages to the gates G of the MIS transistors Tr1 and Tr2. According to the first embodiment, the drive circuit 6 can apply the drive signal independently to the respective gates G of the MIS transistors Tr1 and Tr2. Thus, the semiconductor device according to the first embodiment can prevent the operation of the parasitic bipolar transistor, and can achieve the bidirectional switch capable of avoiding a loss of reliability.

<Structure of Semiconductor Device>

Figure 6:
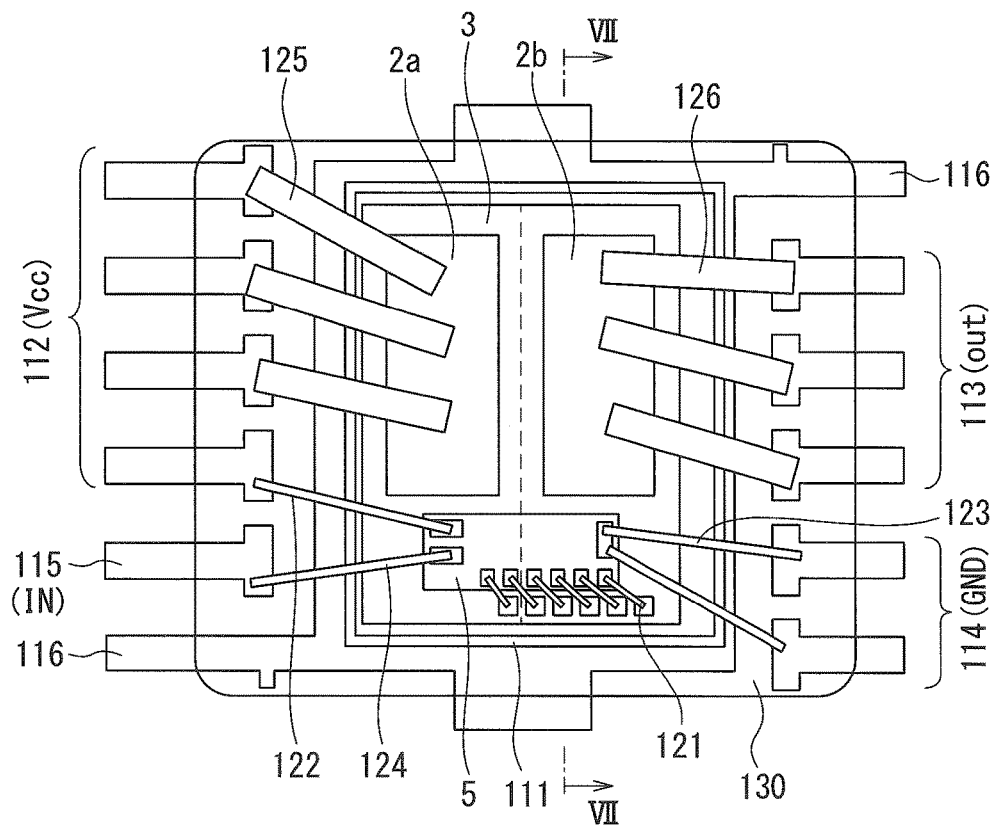
FIG. 6 is a schematic top view illustrating an example of the semiconductor device according to the first embodiment of the present invention.

FIG. 6 is a plan view illustrating an example of a structure of the semiconductor device according to the first embodiment. FIG. 6 illustrates a resin package 130 in a perspective state in order to indicate the inside of the semiconductor device. As illustrated in FIG. 6, the semiconductor device according to the first embodiment includes a lead frame (111, 112, 113, 114, 115, 116), the power circuit chip 3, the control circuit chip 5, and the resin package 130. The power circuit chip 3 is mounted on the lead frame (111 to 116). The control circuit chip 5 is stacked on the power circuit chip 3. The lead frame (111 to 116) has a die pad 111, and lead terminals 112, 113, 114, 115, 116. The die pad 111 is electrically connected to the drain electrode 67 of the power circuit chip 3. The respective lead terminals 112, 113, 114, 115, 116 are electrically connected to electrode pads of each of the power circuit chip 3 and the control circuit chip 5.

Figure 7:
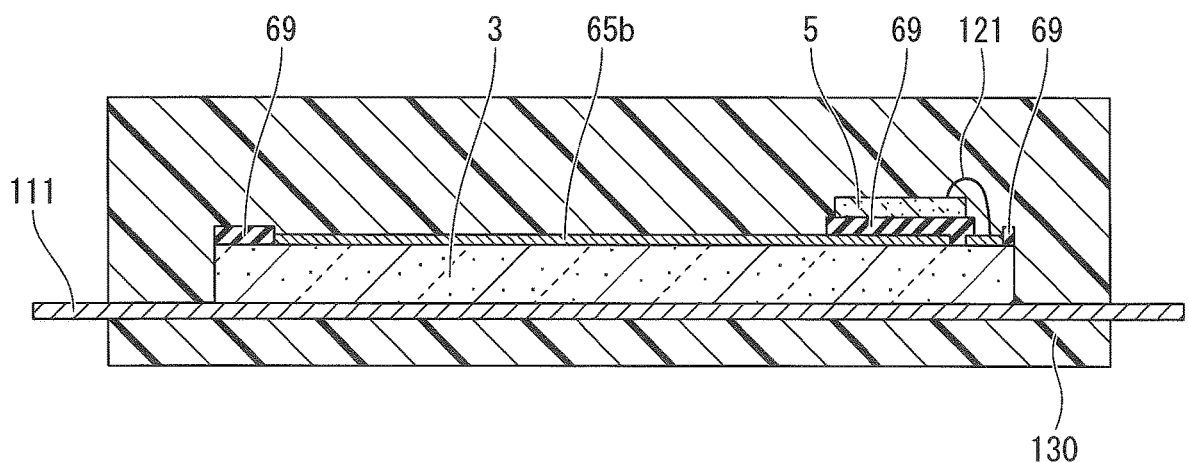
FIG. 7 is a schematic cross-sectional view of a main part of the semiconductor device taken along line A-A in FIG. 6.

As illustrated in FIG. 7, the power circuit chip 3 is supported and fixed onto the die pad 111 via conductive bonding material, such as solder and the like. An insulating protective film 69, such as a polyimide film and the like is laminated on a top surface of the power circuit chip 3. The protective film 69 is provided with an opening. For example, the source electrode pad 65b of the second semiconductor element 2b is exposed to the opening of the protective film 69, as illustrated in FIG. 7. In addition, the source electrode pad 65a of the first semiconductor element 2a, the gate electrode pads 66a and 66b of the first and second semiconductor elements 2a and 2b, and the electrode pad of the temperature sensor 4 are also exposed to the opening of the protective film 69. As illustrated in FIG. 6, the source electrode pad 65a of the first semiconductor element 2a corresponding to the power supply node 12 illustrated in FIG. 1 is electrically connected to the lead terminals (power supply terminals) 112 via bonding wires 125. The source electrode pad 65b of the second semiconductor element 2b corresponding to the output node 13 illustrated in FIG. 1 is electrically connected to the lead terminals (output terminals) 113 via bonding wires 126.

As illustrated in FIG. 7, the control circuit chip 5 is mounted on the protective film 69 laminated on the top surface of the power circuit chip 3 via an insulating bonding material. As illustrated in FIG. 6, various kinds of electrode pads corresponding to the power supply node 12, the ground node 14, and the input node 15 illustrated in FIG. 1 are exposed on the top surface of the control circuit chip 5. The electrode pad corresponding to the ground node 14 is electrically connected to the lead terminals (ground terminals) 114 via bonding wires 123. The electrode pad corresponding to the power supply node 12 is electrically connected to the lead terminal (power supply terminal) 112 via a bonding wire 122. The electrode pad corresponding to the output node 15 is electrically connected to the lead terminal (input terminal) 115 via a bonding wire 124. The lead terminal 116 is electrically connected to the die pad 111. A plurality of pads for wiring between the power circuit chip 3 and the control circuit chip 5 are electrically connected to each other via bonding wires 121.

As described above, in the semiconductor device according to the first embodiment, the first and second semiconductor elements 2a and 2b implementing the main switching circuit 1 share the drift region 50 in common. The first source region 57a, the second source region 57b, and the insulated gate electrode structures (60a, 61a), (60b, 61b) are provided on the first well region 53a and the second well region 53b provided on the upper part of the drift region 50. Thus, in the first embodiment, it is easy to monolithically integrate the main switching circuit 1 into one body and it is possible to achieve the reduction in size of the semiconductor device. Further, in the first embodiment, a chip-on-chip (COC) structure is adopted such that the control circuit chip 5 is stacked on the power circuit chip 3 to be integrated into a single package. Therefore, the mounting area of the semiconductor device can be reduced. The power circuit chip 3 and the control circuit chip 5 may be used in parallel. Alternatively, the control circuit chip 5 may be provided as an external chip.

Figure 8:
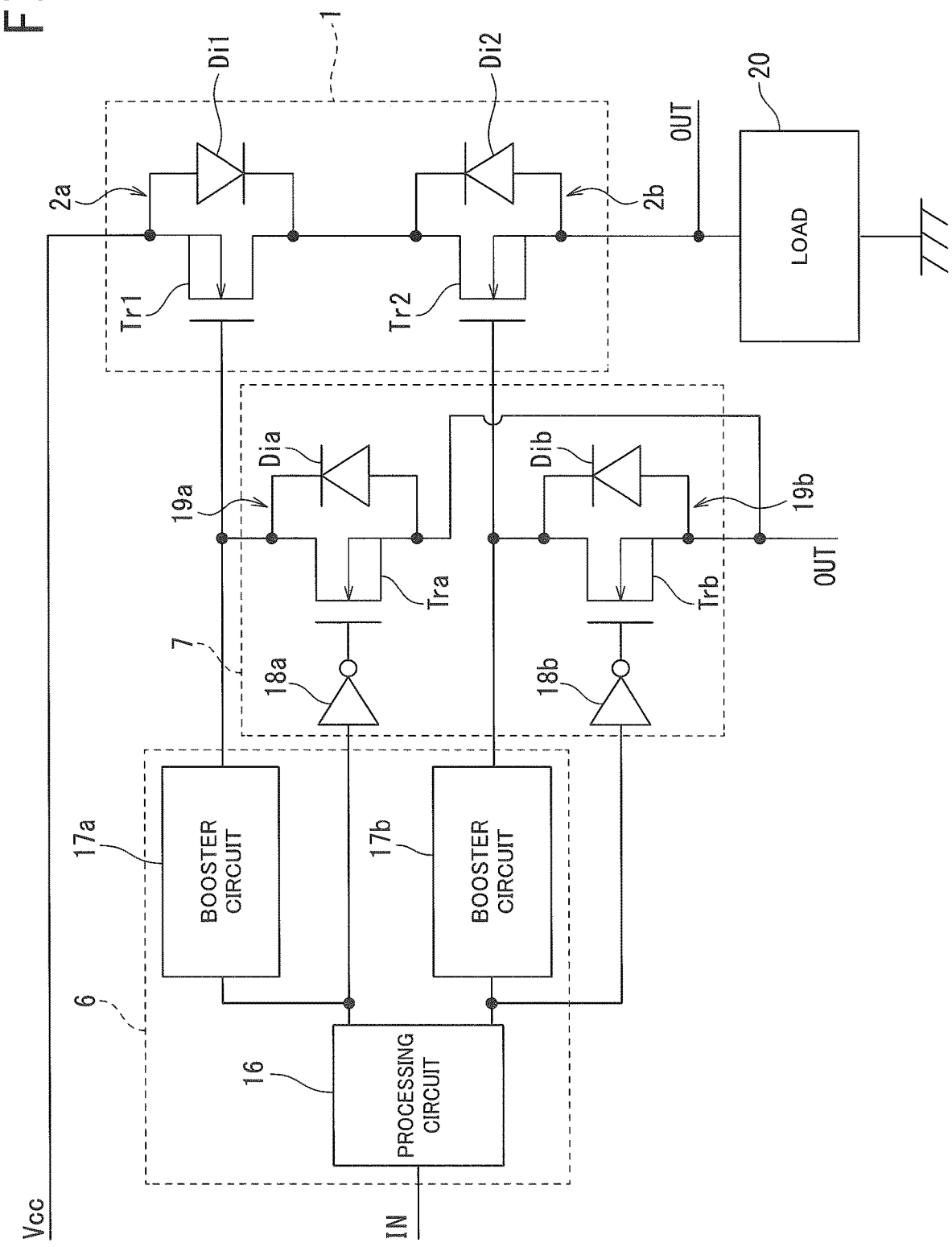
FIG. 8 is a circuit diagram illustrating an example of the semiconductor device according to the first embodiment of the present invention.

In the semiconductor device according to the first embodiment, the drive circuit 6 includes a processing circuit 16 to which a drive signal is input, and booster circuits 17a and 17b electrically and independently connected to the processing circuit 16, as illustrated in FIG. 8. The output circuit 7 includes NOT-logic circuits (inverters) 18a and 18b, and charge-extracting semiconductor elements 19a and 19b.

As illustrated in FIG. 8, the booster circuit 17a is electrically connected to the gate G of the MIS transistor Tr1 of the first semiconductor element 2a, The booster circuit 17b is electrically connected to the gate G of the MIS transistor Tr2 of the second semiconductor element 2b. The booster circuits 17a and 17b are preferably DC/DC converters of charge pump circuits using capacitors. The input side of the NOT-logic circuit 18a is electrically connected to the input side of the booster circuit 17a, and the output side is electrically connected to a gate G of the charge-extracting semiconductor element 19a. A source S and a drain D of a MIS transistor Tra of the charge-extracting semiconductor element 19a are respectively connected in antiparallel to a cathode and an anode of a body diode Dia. A drain D and a source S of a MIS transistor Trb of the charge-extracting semiconductor element 19b are respectively connected in antiparallel to a cathode and an anode of a body diode Dib. The drain D and the source S of the charge-extracting semiconductor element 19a are respectively connected to the output side of the booster circuit 17a and the output node 13 illustrated in FIG. 1. Similarly the input side of the NOT-logic circuit 18b is electrically connected to the input side of the booster circuit 17b, and the output side is electrically connected to a gate G of the charge-extracting semiconductor element 19b. The drain D and the source S of the charge-extracting semiconductor element 19b are respectively connected to the output side of the booster circuit 17b and the output node 13 illustrated in FIG. 1. The processing circuit 16, the booster circuit 17a, the booster circuit 17b, the NOT-logic circuit 18a, and the NOT-logic circuit 18b are all connected to the power supply $V_{CC}$ with the same reference potential $V_{GND}$ (ground (GND) or internal reference potential) as a reference potential.

Figure 9A:
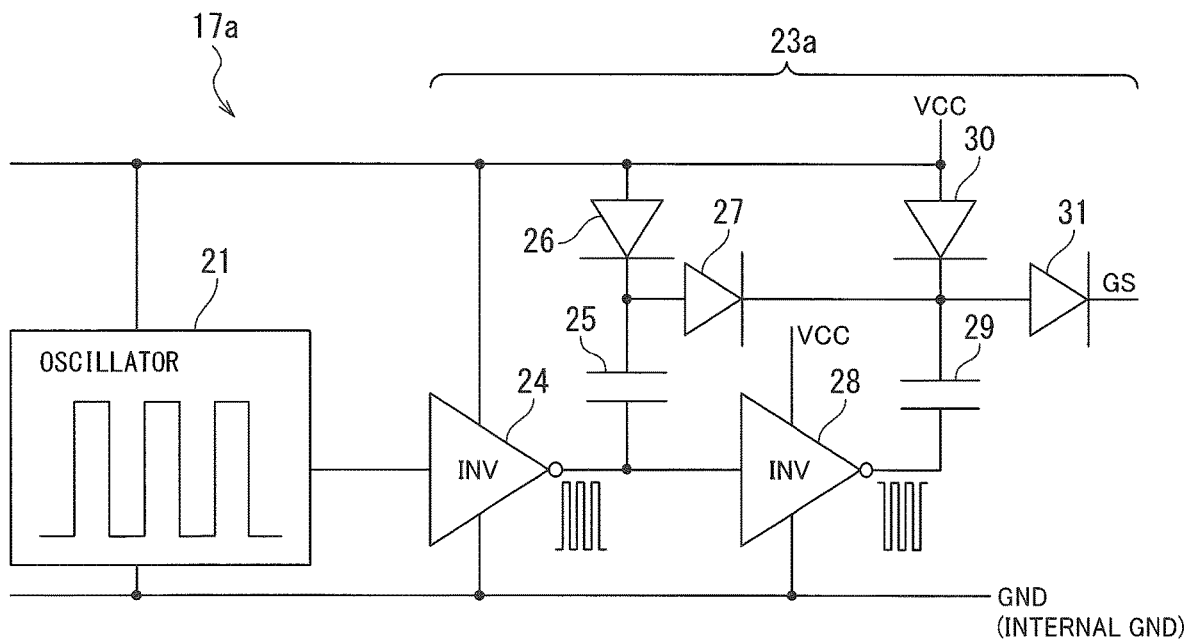
FIG. 9A is a circuit diagram illustrating a configuration example of a booster circuit of the semiconductor device according to the first embodiment of the present invention.
Figure 9B:
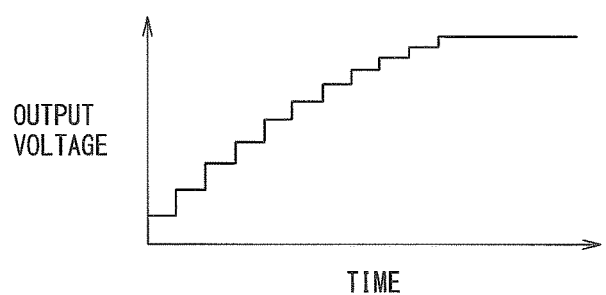
FIG. 9B is a diagram illustrating a rise of an output voltage of the booster circuit illustrated in FIG. 9A.

FIG. 9A is a circuit diagram illustrating a configuration example of the booster circuit 17a in the semiconductor device according to the first embodiment of the present invention. FIG. 9B is a diagram illustrating a rise of an output voltage GS of the booster circuit 17a illustrated in FIG. 9A. The booster circuit 17a includes an oscillation circuit (oscillator) 21 which oscillates in accordance with a signal output from the processing circuit 16, an inverter 24 which logically inverts the signal oscillated by the oscillation circuit 21, and a multistage booster 23a, for example, having two stages.

The oscillation circuit 21 oscillates only when a drive signal of turning on the MIS transistor Tr1 is fed from the processing circuit 16 in the drive signal for turning on or off the MIS transistor Tr1, and then transmits the oscillation signal to the inverter 24.

The inverter 24 inverts the oscillation signal transmitted from the oscillation circuit 21, and transmits the inverted signal to an inverter 28. The multistage booster 23a includes a capacitor 25, and two diodes 26 and 27 of the first stage connected to the output of the inverter 24, and a capacitor 29, and two diodes 30 and 31 of the second stage connected to the output of the inverter 28.

The input side of the inverter 24 in the first stage is connected to the output side of the oscillation circuit 21, the output side of the inverter 24 is connected to the one of the terminals of the capacitor 25, and the other terminal of the capacitor 25 is connected to each of a cathode of the diode 26 and an anode of the diode 27. An anode of the diode 26 is connected to the power supply line of the voltage $V_{CC}$. The power supply line of the voltage $V_{CC}$ is connected to the terminal $V_{CC}$ of the semiconductor device.

The input side of the inverter 28 in the second stage is connected to the output side of the inverter 24, the output side of the inverter 28 is connected to the one of the terminals of the capacitor 29, and the other terminal of the capacitor 29 is connected to each of a cathode of the diode 30, an anode of the diode 31, and the cathode of the diode 27. An anode of the diode 30 is connected to the power supply line of the voltage $V_{CC}$. A cathode of the diode 31 composes the output side of the booster circuit 17a.

In the booster circuit 17a having the above configuration, the oscillation circuit 21 starts oscillating when the drive signal of turning on the MIS transistor Tr1 is fed from the processing circuit 16. When the signal transmitted from the oscillation circuit 21 is, for example, in H-level (high-level), the H-level signal is fed to the inverter 24 in the first stage of the multistage booster 23a. Then, the output of the inverter 24 turns to L-level (low-level) so as to connect one terminal of the capacitor 25 to $V_{GND}$, and the capacitor 25 is charged via the diode 26 with the voltage Vcc of the power supply line. Thus, the terminal voltage of the capacitor 25 results in [$V_{CC}$–Vf] (Vf is a forward voltage of the diode 26).

When the signal from the oscillation circuit 21 turns to L-level, the L-level signal is fed to the inverter 24 in the first stage of the multistage booster 23a. Then, the output of the inverter 24 turns to H-level, and the voltage $V_{CC}$ of the power supply line is applied to the one terminal of the capacitor 25. And the voltage at the other terminal of the capacitor 25 results in [$2(V_{CC}-V_{GND})-Vf+V_{GND}$]. Since the H-level signal is fed to the inverter 28 in the second stage of the multistage booster 23a, the output of the inverter 28 is in L-level, Thus, one terminal of the capacitor 29 is connected to $V_{GND}$, and the voltage of [$2(V_{CC}-V_{GND})-Vf$] is applied to the other terminal of the capacitor 29 via the diode 27 in the first stage of the multistage booster 23a. The terminal voltage of the capacitor 29 thus results in [$2(V_{CC}-V_{GND})-2Vf+V_{GND}$] (Vf is a forward voltage common to the respective diodes 26 and 27).

The above boosted voltage is then transmitted as the output voltage OS of the booster circuit 17a via the diode 31. The output signal of the boosted voltage is continuously obtained by alternately repeating the L-level and the H-level of the signal fed from the oscillation circuit 21, to be applied as the gate voltage of the MIS transistor Tr1. The booster circuit 17b has the same configuration, and the output signal is applied as the gate voltage of the MIS transistor Tr2.

Second Embodiment

Figure 10:
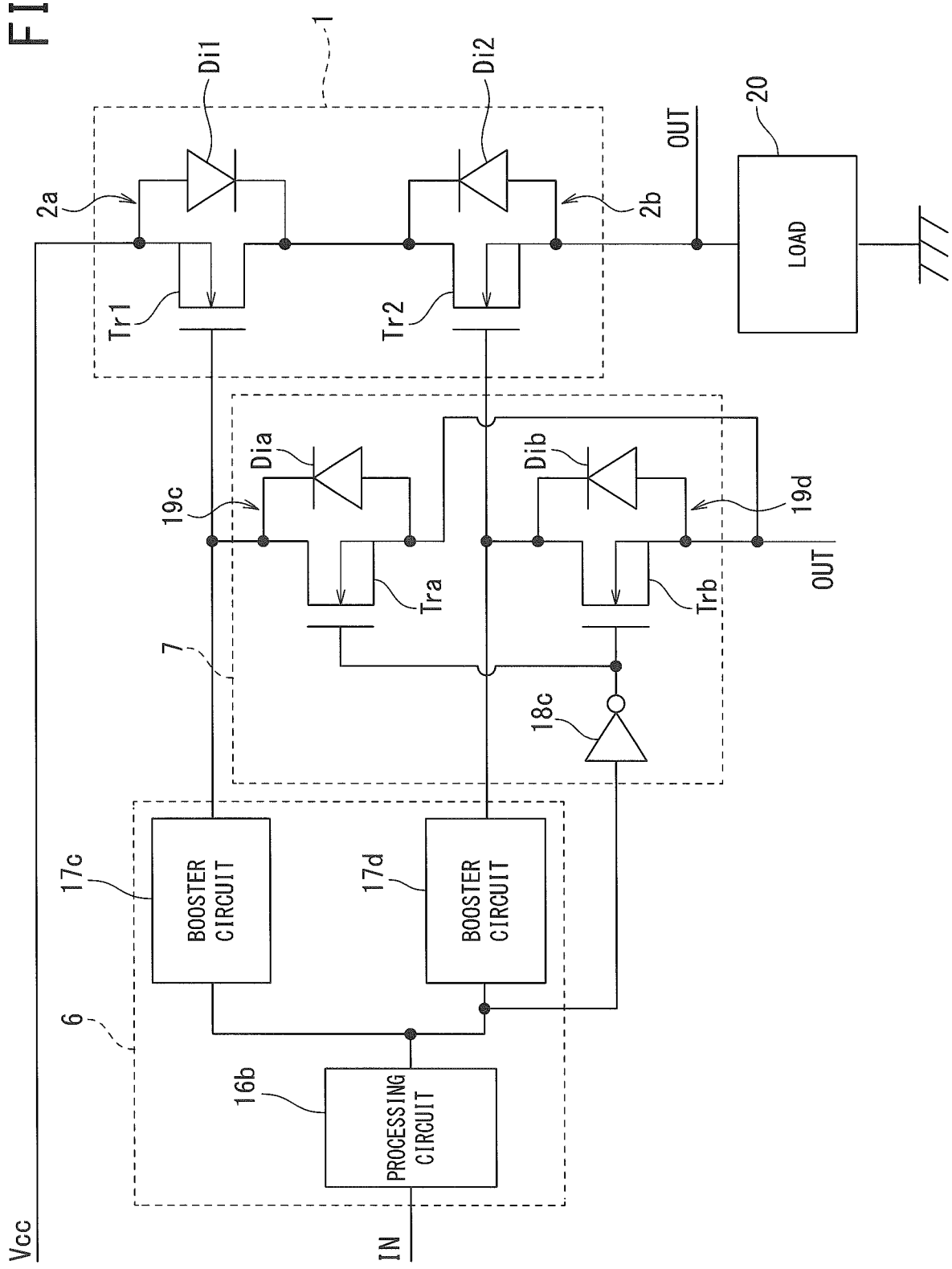
FIG. 10 is a circuit diagram illustrating an example of a semiconductor device according to a second embodiment of the present invention.

FIG. 10 is a circuit diagram illustrating an example of a semiconductor device according to a second embodiment of the present invention. As illustrated in FIG. 10, the drive circuit 6 includes a processing circuit 16b to which a drive signal is fed, and booster circuits 17c and 17d electrically connected in common to the processing circuit 16b. The output circuit 7 includes charge-extracting semiconductor elements 19c and 19d electrically connected in common to a NOT-logic circuit (inverter) 18c. The semiconductor device according to the second embodiment differs from the first embodiment in including the booster circuits 17c and 17d electrically connected in common to the processing circuit 16b, and the charge-extracting semiconductor elements 19c and 19d electrically connected in common to the NOT-logic circuit (inverter) 18c. The other configurations are the same as those of the semiconductor device according to the first embodiment, and overlapping explanations are not repeated below.

The booster circuit 17c has a faster rise of the output, voltage than the booster circuit 17d. The charge-extracting semiconductor element 19c has lower charge extraction capability than the charge-extracting semiconductor element 19d. As used herein, the expression "having lower charge extraction capability" denotes that a value of current that can flow through is low. For example, the channel width of the charge-extracting semiconductor element 19c may be shorter than the channel width of the charge-extracting semiconductor element 19d. The following three examples can be used as the configuration in which the booster circuit 17c has a faster rise of the output voltage than the booster circuit 17d.

First Example of Booster Circuit

Figure 11A:
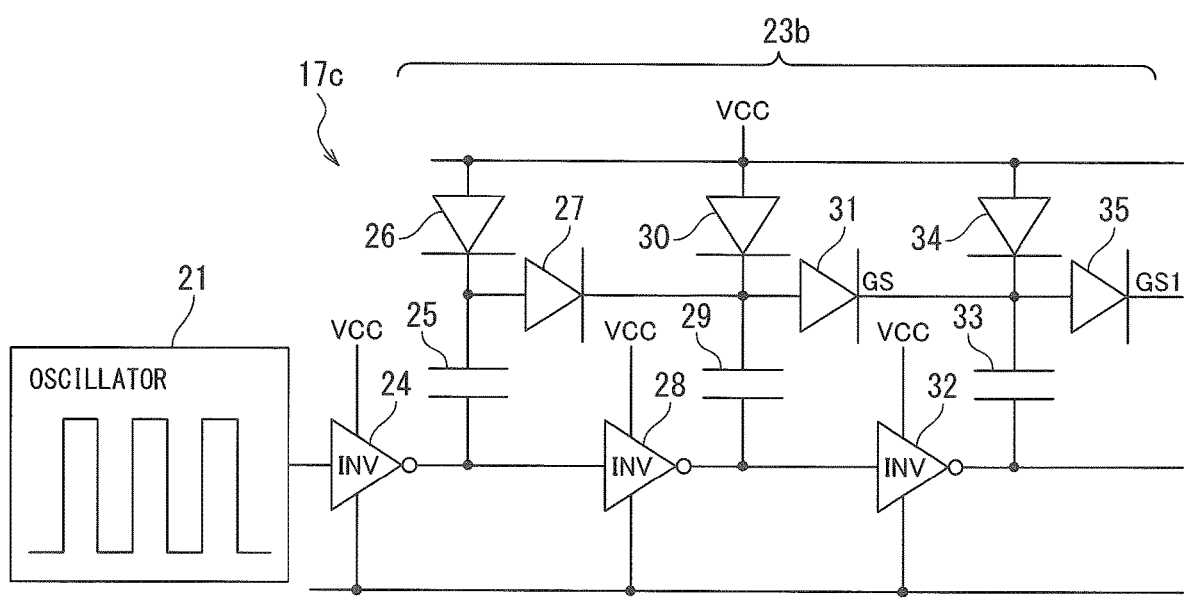
FIG. 11A is a circuit diagram illustrating a configuration example of a booster circuit of the semiconductor device according to the second embodiment of the present invention.
Figure 11B:
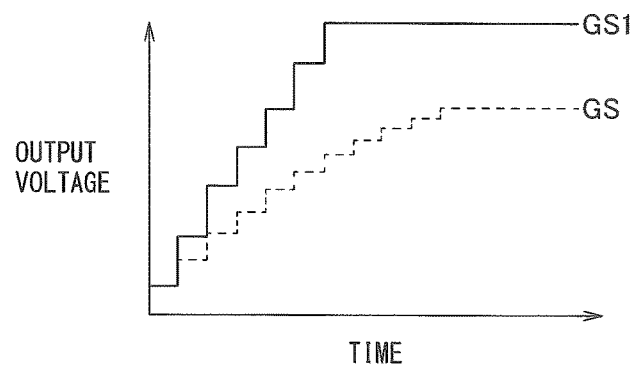
FIG. 11B is a diagram illustrating a rise of an output voltage of the booster circuit illustrated in FIG. 11A.

FIG. 11A is a circuit diagram illustrating a first example of the booster circuit of the semiconductor device according to the second embodiment, and FIG. 11B is a diagram illustrating a rise of an output voltage of the booster circuit 17c illustrated in FIG. 11A. The booster circuit 17d is the same as the booster circuit 17a illustrated in FIG. 9A. The booster circuit 17c illustrated in FIG. 11A includes a multistage booster 23b having three stages, which is greater number of stages than that in the booster circuit 17d. By setting the number of the stages of the multistage booster 23b of the booster circuit 17c to be greater than that of the booster circuit 17d, the rise of the output voltage GS1 can be faster than the output voltage OS of the booster circuit 17a illustrated in FIG. 9A, as illustrated in FIG. 11B.

When the oscillation signal from the oscillation circuit 21 turns to H-level, the inverter 28 in the second stage transmits an H-level signal. The power supply voltage $V_{CC}$ is thus applied to one terminal of the capacitor 29. Thus, the voltage $V_{CC}$ is superposed on the voltage [$2(V_{CC}-V_{GND})$ $2Vf+V_{GND}$] to result in [$3(V_{CC}-V_{GND})-2Vf+V_{GND}$] at the other terminal of the capacitor 29. In such case, an inverter 32 in the third stage of the booster circuit 17c transmits an L-level signal. Then, one terminal of a capacitor 33 is connected to the internal potential $V_{GND}$, and the voltage of $[3(V_{CC}-V_{GND})-2Vf+V_{GND}]$ is applied to the other terminal of the capacitor 33 via the diode 31 at the second stage. Thus, the terminal voltage of the capacitor 33 results in $[3(V_{CC}-V_{GND})-3Vf+V_{GND}]$. The voltage boosted to $[3(V_{CC}-V_{GND})-3Vf+V_{GND}]$ is fed as a gate signal GS1 via a diode 35.

FIG. 12 is a timing chart for explaining a control method of the semiconductor device according to the second embodiment of the present invention. As illustrated in FIG. 12, the input signal fed to the drive circuit 6 is transmitted to the respective booster circuits 17c and 17d via the processing circuit 16b. A drive signal of voltage Vg1 is fed to the gate G of the MIS transistor Tr1 from the booster circuit 17c, and rises during a rising time Dr1. A drive signal of voltage Vg2 is fed to the gate G of the MIS transistor Tr2 from the booster circuit 17d, and rises during a rising time Dr2. The voltage Vg1 is higher than the voltage Vg2. The rising time of the output voltage is different between the booster circuit 17c and the booster circuit 17d, the rising time Dr2 is set to be longer than the rising time Dr1. The difference can reliably lead the MIS transistor Tr1 to reach the turn-on state faster than the MIS transistor Tr2, so as to prevent the operation of the parasitic bipolar transistor illustrated in FIG. 3.

When the input signal is in H-level, the output of the NOT-logic circuit 18c is at the L level, so as to lead the charge-extracting semiconductor elements 19c and 19d to be in the blocked state. When the input signal is at the L level to block the MIS transistors Tr1 and Tr2, the output of the NOT-logic circuit 18c is in H-level so that the charge-extracting semiconductor elements 19c and 19d are in the turn-on state. Therefore, charges accumulated in the booster circuits 17c and 17d and the gates G of the MIS transistors Tr1 and Tr2 can be extracted. As illustrated in FIG. 12, a falling time Df1 when the MIS transistor Tr1 is turned off is longer than a falling time Df2 when the MIS transistor Tr2 is turned off. Since the MIS transistor Tr1 is thus inevitably led to the turn-on state when the MIS transistor Tr2 is in the turn-on state, it is possible to prevent the operation of the parasitic bipolar transistor.

Second Example of Booster Circuit

Figure 13A:
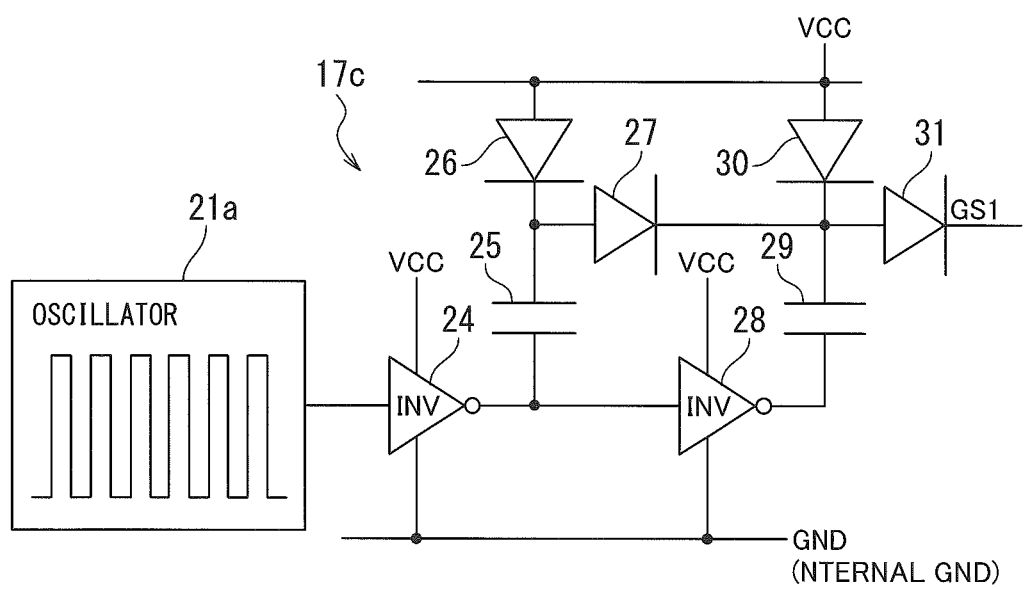
FIG. 13A is a circuit diagram illustrating another configuration example of a booster circuit of the semiconductor device according to the second embodiment of the present invention.
Figure 13B:
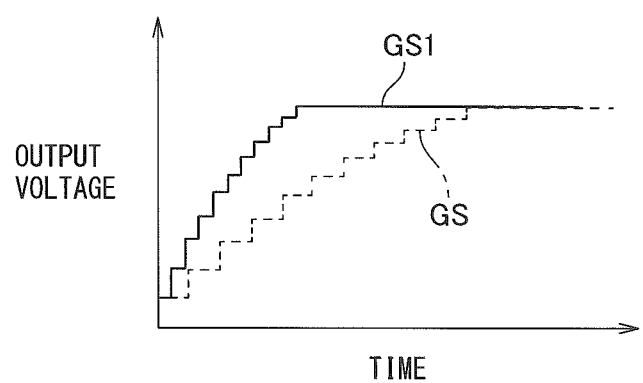
FIG. 13B is a diagram illustrating a rise of an output voltage of the booster circuit illustrated in FIG. 13A.

FIG. 13A is a circuit diagram illustrating a second example of the booster circuit of the semiconductor device according to the second embodiment of the present invention, and FIG. 13B is a diagram illustrating the rise of the output voltage of the booster circuit illustrated in FIG. 13A. The booster circuit 17d is the same as the booster circuit 17a illustrated in FIG. 9A. The booster circuit 17c illustrated in FIG. 13A includes an oscillation circuit 21a having a higher frequency than that in the booster circuit 17d. As illustrated in FIG. 13B, by setting the frequency of the oscillation circuit 21a of the booster circuit 17c to be higher than the frequency of the oscillation circuit 21 of the booster circuit 17d, the rise of the output voltage GS1 can be faster than the output voltage GS of the booster circuit 17a illustrated in FIG. 9A, as illustrated in FIG. 13B.

Third Example of Booster Circuit

Figure 14A:
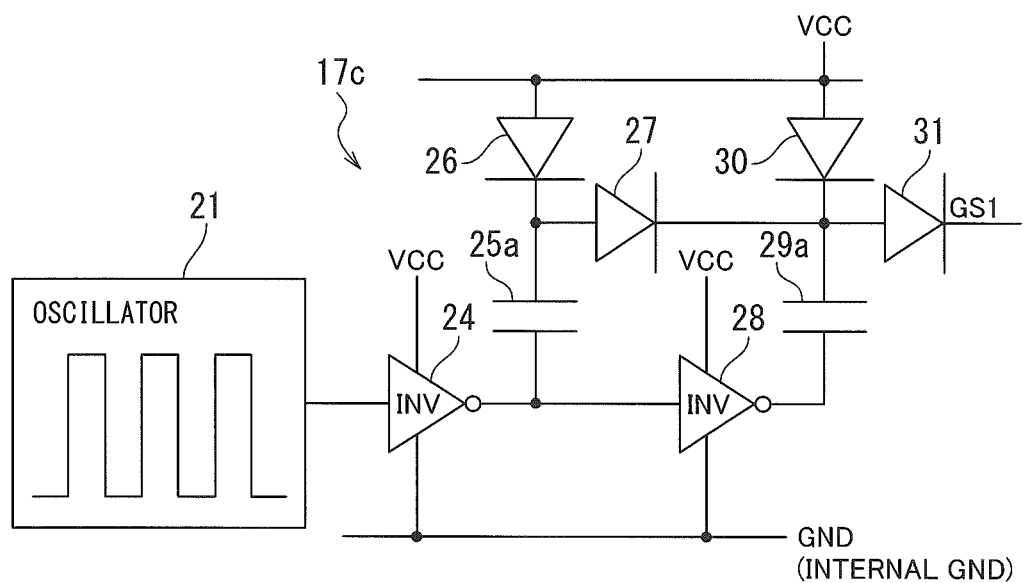
FIG. 14A is a circuit diagram illustrating still another configuration example of a booster circuit of the semiconductor device according to the second embodiment of the present invention.
Figure 14B:
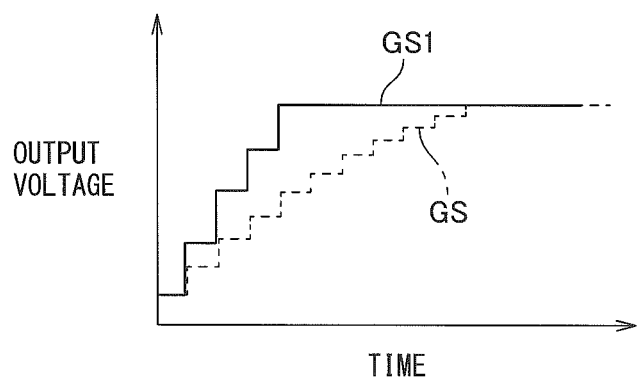
FIG. 14B is a diagram illustrating a rise of an output voltage of the booster circuit illustrated in FIG. 14A.

FIG. 14A is a circuit diagram illustrating a third example of the booster circuit of the semiconductor device according to the second embodiment of the present invention, and FIG. 14B is a diagram illustrating the rise of the output voltage of the booster circuit illustrated in FIG. 14A. The booster circuit 17d is the same as the booster circuit 17a illustrated in FIG. 9A. The booster circuit 17c illustrated in FIG. 14A includes a capacitor 25a having a greater capacitance than that in the booster circuit 17d. Thus, by setting the capacitance of the capacitor 25a of the booster circuit 17c to be greater than the capacity of the capacitor 25 of the booster circuit 17d, the rise of the output voltage GS1 can be faster than the output voltage GS of the booster circuit 17a illustrated in FIG. 9A, as illustrated in FIG. 14B.

Figure 15:
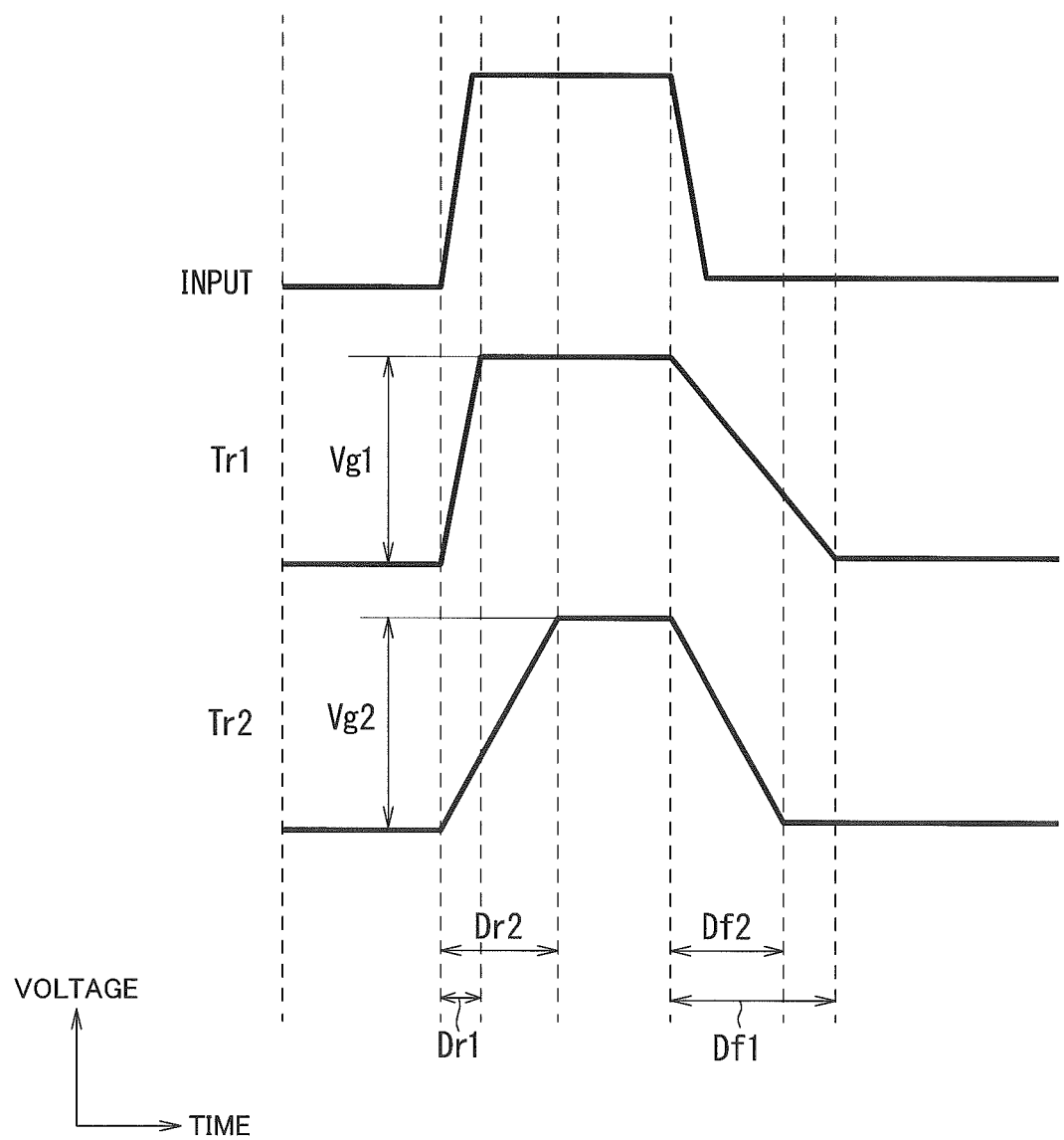
FIG. 15 is a timing chart for explaining another example of the control method of the semiconductor device according to the second embodiment of the present invention.

FIG. 15 is a timing chart for explaining a control method in the second example or the third example according to the second embodiment. As in the case illustrated in FIG. 12, the NHS transistor Tr1 is reliably led to reach the turn-on state faster than the MIS transistor Tr2, and the MIS transistor Tr1 is turned off later than the MIS transistor Tr2. Since the MIS transistor Tr1 is thus inevitably led to the turn-on state when the MIS transistor Tr2 is in the turn-on state, it is possible to prevent the operation of the parasitic bipolar transistor.

Other Embodiments

While the present invention has been described above by reference to the embodiments and modified examples, it should be understood that the present invention is not intended to be limited to the descriptions of the Specification and the drawings implementing part of this disclosure. Various alternative embodiments, examples, and technical applications will be apparent to those skilled in the art according to the spirit and scope of the disclosure of the embodiments. It should be noted that the present invention includes various embodiments, which are not disclosed herein, including elements optionally modified as alternatives to those illustrated in the above embodiments and modified examples. Therefore, the scope of the present invention is defined only by the subject matter according to the claims reasonably derived from the description heretofore.

What is claimed is:

1. A semiconductor device, comprising:
   a main switching circuit including a first semiconductor element and a second semiconductor element having a semiconductor region of a first conductivity type as a common region, including respectively a first well region of a second conductivity type and a second well region of the second conductivity type provided in an upper portion of the common region, the common region and the first well region being in contact with each other and the common region and the second well region being in contact with each other, the first semiconductor element being provided with a first source region of the first conductivity type in an upper portion of the first well region, the second semiconductor element being provided with a second source region of the first conductivity type in an upper portion of the second well region; and
   a drive circuit configured to independently apply a first drive signal and a second drive signal respectively to a control electrode of the first semiconductor element and a control electrode of the second semiconductor element.

2. The semiconductor device of claim 1, wherein
   each of the first and second semiconductor elements further includes a contact region of the second conductivity type provided in the upper portion of each of the first and second well regions, and the contact region of the first semiconductor element is electrically connected to a power supply terminal, and the contact region of the second semiconductor element is electrically connected to an output terminal.

3. The semiconductor device of claim 1, wherein the semiconductor region includes:
a first semiconductor region; and
a second semiconductor region having a higher impurity concentration than the first semiconductor region, the second semiconductor region being in contact with the first semiconductor region, and separated from the first and second well regions.

4. The semiconductor device of claim 3, wherein
the first semiconductor region is a first semiconductor layer having the first and second well regions; and
the second semiconductor region is a second semiconductor layer provided below the first semiconductor layer.

5. The semiconductor device of claim 1, wherein the drive circuit includes first and second booster circuits electrically and independently connected to the control electrodes of the first and second semiconductor elements, respectively, and a processing circuit to which the first and second booster circuits are electrically and independently connected.

6. The semiconductor device of claim 5, further comprising an output circuit including:
an NOT-logic circuit in which an input of the NOT-logic circuit is electrically connected to each input side of the first and second booster circuits, and
charge-extracting semiconductor elements each having a control electrode electrically connected to an output side of the NOT-logic circuit, and each having one electrode region electrically connected to one of the first and second booster circuits and another electrode region electrically connected to the output terminal.

7. The semiconductor device of claim 5, wherein a level of an output voltage of the first booster circuit, connected to the control electrode of the first semiconductor element, is greater than a level of an output voltage of the second booster circuit connected to the control electrode of the second semiconductor element.

8. The semiconductor device of claim 5, wherein a rise of an output voltage of the first booster circuit connected to the control electrode of the first semiconductor element is faster than a rise of an output voltage of the second booster circuit connected to the control electrode of the second semiconductor element.

9. The semiconductor device of claim 1, further comprising a package containing a power circuit chip in which the first and second semiconductor elements are integrated into a single chip and a control circuit chip in which the drive circuit is integrated into a single chip, and the package further having a power supply terminal electrically leading the common region to an outside, configured to connect to an external power supply and an output terminal electrically leading the second source region to the outside, configured to connect to an external load.

10. A method for controlling a semiconductor device which includes a main switching circuit including an insulated gate first semiconductor element and an insulated gate second semiconductor element having a semiconductor region of a first conductivity type as a common region, including respectively a first well region of a second conductivity type and a second well region of the second conductivity type formed in an upper portion of the common region, the common region and the first well region being in contact with each other and the common region and the second well region being in contact with each other, the first semiconductor element being provided with a first surface electrode electrically connected to a power supply terminal on an upper surface of a first source region of the first conductivity type provided in an upper portion of the first well region, the second semiconductor element being provided with a second surface electrode electrically connected to an output terminal on an upper surface of a second source region provided in an upper portion of the second well region, the method comprising:
applying a first drive signal to a control electrode of the first semiconductor element to control a turn-on and a turn-off of the first semiconductor element; and
applying a second drive signal, independent of the first drive signal, to a control electrode of the second semiconductor element to control a turn-on and a turn-off of the second semiconductor element,
wherein the turn-on and the turn-off by the second drive signal are switched while the first semiconductor element is turned-on.

11. The method of claim 10, wherein the first and second drive signals are applied to the control electrodes of the corresponding first and second semiconductor elements via booster circuits independent of each other.

12. The method of claim 11, wherein a voltage level of the first drive signal turning on the first semiconductor element is higher than a voltage level of the second drive signal turning on the second semiconductor element.

13. The method of claim 10, wherein the semiconductor region includes:
a first semiconductor layer having the first and second well regions, and
a second semiconductor layer provided below the first semiconductor layer, having a higher impurity concentration than the first semiconductor layer, the second semiconductor layer being in contact with the first semiconductor layer, and separated from the first and second well regions.

14. The method of claim 10, wherein
a first booster circuit electrically and independently connected to the control electrode of the first semiconductor element applies the first drive signal to the control electrode of the first semiconductor element,
a second booster circuit electrically and independently connected to the control electrode of the second semiconductor element applies the second drive signal to the control electrode of the second semiconductor element,
respectively, and a processing circuit to which the first and second booster circuits are electrically and independently connected.

15. The method of claim 14, wherein
the first drive signal applied by the first booster circuit to the control electrode of the first semiconductor element rises to a first voltage during a first time period;
the second drive signal applied by the second booster circuit to the control electrode of the second semiconductor element rises to a second voltage during a second time period, the second time period being longer than the first time period, such that the first semiconductor element reaches the turn-on state faster than the second semiconductor element.

16. The semiconductor device of claim 1, wherein the first well region and the second well region have a same depth with respect to the semiconductor region.

* * * * *